United States Patent
Rossini et al.

(10) Patent No.: US 9,362,255 B2
(45) Date of Patent: Jun. 7, 2016

(54) METHOD FOR MANUFACTURING A MULTILAYER STRUCTURE ON A SUBSTRATE

(71) Applicant: Commissariat à l'énergie atomique et aux énergies alternatives, Paris (FR)

(72) Inventors: Umberto Rossini, Coublevie (FR); Thierry Flahaut, Cholonge (FR); Vincent Larrey, Murette (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/369,701

(22) PCT Filed: Dec. 27, 2012

(86) PCT No.: PCT/FR2012/053089
§ 371 (c)(1),
(2) Date: Jun. 29, 2014

(87) PCT Pub. No.: WO2013/098528
PCT Pub. Date: Jul. 4, 2013

(65) Prior Publication Data
US 2014/0353853 A1 Dec. 4, 2014

(30) Foreign Application Priority Data
Dec. 29, 2011 (FR) .................................. 11 62525

(51) Int. Cl.
*H01L 33/00* (2010.01)
*H01L 23/00* (2006.01)
(Continued)

(52) U.S. Cl.
CPC ............ *H01L 24/89* (2013.01); *H01L 21/2007* (2013.01); *H01L 21/76254* (2013.01);
(Continued)

(58) Field of Classification Search
USPC .............................. 438/458, 57; 257/E21.001
See application file for complete search history.

(56) References Cited

U.S. PATENT DOCUMENTS

| 7,094,666 | B2 * | 8/2006 | Henley | ................ | H01L 21/2007 257/E21.122 |
| 7,391,047 | B2 * | 6/2008 | Henley | ................ | H01L 21/2007 257/18 |

(Continued)

FOREIGN PATENT DOCUMENTS

| JP | 2004247405 | 9/2004 |
| JP | 2009177155 | 8/2009 |

(Continued)

OTHER PUBLICATIONS

European Patent Office, International Preliminary Examination Report for PCT/FR2012/053089, translation undated.

(Continued)

*Primary Examiner* — Telly Green
(74) *Attorney, Agent, or Firm* — Kevin R Erdman; Brannon Sowers & Cracraft PC

(57) ABSTRACT

The invention relates to a method for manufacturing a multilayer strucute on a first substrate, the method including: using the first substrate made of a first material having a Young's modulus $E_v$ and a thickness $e_v$, and using a second substrate covered by the multilayer structure, the second substrate being made of a second material having a Young's modulus $E_s$ that is different from the Young's modulus $E_v$ and a thickness $e_s$, the thicknesses $e_s$ and $e_v$ complying, plus or minus 10%, with the relation (I); molecularly bonding the first substrate and the multilayer structure together; and removing the second substrate.

20 Claims, 2 Drawing Sheets

(51) Int. Cl.
*H01L 21/20* (2006.01)
*H01L 21/762* (2006.01)

(52) U.S. Cl.
CPC ............... *H01L 24/27* (2013.01); *H01L 24/28* (2013.01); *H01L 2224/8003* (2013.01); *H01L 2224/80896* (2013.01)

(56) References Cited

U.S. PATENT DOCUMENTS

| | | | |
|---|---|---|---|
| 7,427,554 B2 * | 9/2008 | Henley | H01L 21/76251 257/18 |
| 7,459,726 B2 | 12/2008 | Kato et al. | |
| 7,595,499 B2 * | 9/2009 | Henley | H01L 21/2007 257/18 |
| 7,811,900 B2 * | 10/2010 | Henley | 438/458 |
| 8,093,136 B2 | 1/2012 | Endo et al. | |
| 8,871,348 B2 | 10/2014 | Sawada et al. | |
| 2006/0024917 A1 * | 2/2006 | Henley | H01L 21/2007 438/455 |
| 2006/0160329 A1 * | 7/2006 | Henley | H01L 21/2007 438/457 |
| 2007/0037323 A1 * | 2/2007 | Henley | H01L 21/76251 438/149 |
| 2008/0061452 A1 * | 3/2008 | Nishihata et al. | 257/798 |
| 2008/0141510 A1 * | 6/2008 | Henley | H01L 21/2007 29/25.01 |
| 2008/0179547 A1 * | 7/2008 | Henley | 250/492.21 |
| 2008/0213974 A1 * | 9/2008 | Okuda et al. | 438/459 |
| 2010/0178723 A1 | 7/2010 | Henley | |
| 2010/0289037 A1 | 11/2010 | Matsumoto | |
| 2011/0215300 A1 * | 9/2011 | Guo et al. | 257/29 |
| 2012/0058624 A1 | 3/2012 | Henley | |
| 2012/0111406 A1 | 5/2012 | Sawada | |
| 2013/0215300 A1 * | 8/2013 | Kobayashi et al. | 348/294 |
| 2013/0273714 A1 * | 10/2013 | Wei et al. | 438/458 |
| 2013/0322811 A1 * | 12/2013 | Meade | 385/14 |

FOREIGN PATENT DOCUMENTS

| | | |
|---|---|---|
| JP | 2013534056 | 8/2013 |
| JP | 2013239716 | 11/2013 |
| WO | 2008030960 | 9/2007 |
| WO | 2008082723 A2 | 1/2008 |
| WO | 2009090780 | 10/2008 |
| WO | 2011010685 | 7/2010 |
| WO | 2011010685 A1 | 1/2011 |
| WO | 2012003157 | 6/2011 |

OTHER PUBLICATIONS

European Patent Office, International Search Report for PCT/FR2012/053089, Feb. 18, 2013.

Zeng, K et al, "Investigation of Mechanical Properties Transparent Conducting Oxide Thin Films", Thin Solid Films, Oct. 22, 2003, Elsevier-Sequoia S.A., Lausanne, Switzerland.

Office Action for parallel application JP 2014-549523 dated Dec. 2, 2014.

\* cited by examiner

METHOD FOR MANUFACTURING A MULTILAYER STRUCTURE ON A SUBSTRATE

CROSS-REFERENCE TO RELATED APPLICATIONS

The present application is a National Stage of PCT International Application Serial Number PCT/FR2012/053089, filed Dec. 27, 2012, which claims priority under 35 U.S.C. §119 of French Patent Application Serial Number 11/62525, filed Dec. 29, 2011, the disclosures of which are incorporated by reference herein.

BACKGROUND OF THE INVENTION

1. Field of the Invention

The present invention relates to a method of manufacturing a multilayer structure, for example corresponding to an integrated circuit wafer, on a final support by molecular bonding. The present invention also relates to an initial support for such a multilayer structure.

2. Description of the Related Art

For certain applications, it is desirable to form an integrated circuit wafer on a support. In particular, for applications in optics, the support should be isolating and transparent. It for example is glass. An example of application relates to the manufacturing of a transmissive display screen.

FIGS. 1A to 1C show simplified cross-section views of structures obtained at successive steps of a method of manufacturing an integrated circuit wafer on a support by molecular bonding.

FIG. 1A schematically shows an element 10 having an SOI (Silicon On Insulator) structure.

Element 10 comprises an initial support 12, for example, a single-crystal silicon substrate. Thickness e1 of initial support 12 is for example a few hundred micrometers and is, for example, equal to approximately 700 μm. Initial support 12 may correspond to a cylinder having a diameter greater than some hundred millimeters, and is equal, for example, to approximately 200 mm or 300 mm. Initial support 12 comprises a planar surface 13 covered with an insulating layer 14, for example, made of silicon dioxide. Thickness e2 of insulating layer 14 is for example in the order of 1 μm. Insulating layer 14 is covered with an integrated circuit wafer 16. Integrated circuit wafer 16 comprises a stack of layers having active and/or passive electronic components and conductive tracks connecting these components. As an example, integrated circuit wafer 16 comprises a layer 18 of a semiconductor material, for example, single-crystal silicon, covering insulating layer 14 and having the active and/or passive electronic components, for example, transistors 20, formed inside and on top of it. Integrated circuit wafer 16 further comprises a stack of insulating layers 22, for example, made of silicon dioxide, covering silicon layer 18 and having tracks 24 and vias 26 of a conductive material capable of coming into contact with the electronic components formed therein. As an example, thickness e3 of wafer 16 is in the order of a few micrometers. The last insulating layer of stack 22 of insulating layers forms a planar upper surface 28 opposite to support 12.

FIG. 1B shows the structure obtained after the performing of a molecular bonding between surface 28 of element 10 and a final support 30. Final support 30 is made of a material different from silicon, for example, made of glass. Thickness ev of final support 30 is greater than several hundred micrometers, and is, for example, equal to approximately 700 μm. Final support 30 comprises a surface 32 applied against surface 28. Molecular bonding comprises creating a bond between surfaces 28 and 32 with no addition of external material (such as glue or an adhesive material). To achieve this, surfaces 28 and 32, properly cleaned, are placed into contact with each other at ambient temperature. A pressure may be locally exerted on support 30 to initiate the bonding. The propagating front of the bonded area then spreads from the initiation region over all the opposite surfaces.

FIG. 1C shows the structure obtained after the removal of initial support 12. The removal of initial support 12 may comprise a step of chem.-mech.rectification to remove most of initial support 12, followed by a step of selective chemical etching to remove the rest of initial support 12. Insulating layer 14 may be used as a stop layer on removal of initial support 12.

The method then generally carries on with the forming of conductive vias through insulating layer 14 and silicon layer 18 and connected to metal tracks 24 of integrated circuit wafer 16. The forming of these vias comprises photolithography steps, including steps where a resist layer covering insulating layer 14 is exposed to a radiation through a mask to reproduce the mask pattern on the resin layer. To achieve this, the exposure device, which particularly comprises the optical systems for forming the pattern in the resist layer, should be accurately placed with respect to integrated circuit wafer 16.

In an industrial scale manufacturing process, the photolithography steps should be carried out as fast as possible. To achieve this, the exposure device is previously adjusted so that the pattern to be transferred forms properly with no additional adjustment in the resin layer for an integrated circuit wafer which would have the expected dimensions.

However, deformations can be observed in integrated circuit wafer 16 after the bonding step. In particular, a narrowing can be observed, that is, two marks formed on bonding surface 28 before the bonding step have come closer to each other after the bonding step. The relative narrowing may be in the order of 20 ppm.

Such deformations may generally be at least compensated for by the exposure device. However, this results in additional adjustment steps which are not compatible with the carrying out of a manufacturing process at an industrial scale. Further, in certain cases, such deformations may be too large to be compensated for by the exposure device.

A method of manufacturing by molecular bonding a multilayer structure, for example, corresponding to an integrated circuit wafer, on a final support by molecular bonding of the wafer on the support where deformations in the integrated circuit wafer which result from the bonding operation are decreased, or even suppressed, is thus needed.

SUMMARY OF THE INVENTION

An object of the present invention is to provide a method of manufacturing a multilayer structure on a support by molecular bonding, which overcomes the disadvantages of known methods.

According to another object of the present invention, the relative deformations in the multilayer structure which result from the bonding operation are smaller than 5 ppm.

According to another object of the present invention, the manufacturing method using a molecular bonding comprises a decreased number of additional steps as compared with a known manufacturing method using molecular bonding.

Thus, the present invention provides a method of manufacturing a multilayer structure on a first support. The method comprises using the first support made of a first material having a Young's modulus Ev, and a thickness ev, and using a second support covered with the multilayer structure, the second support being made of a second material having a Young's modulus Es different from Young's modulus Ev, and a thickness es, thicknesses es and ev verifying, to within 10%, relation:

$$e_s = \frac{E_v}{E_s} e_v;$$

the molecular bonding between the first support and the multilayer structure; and removing the second support.

According to an embodiment of the invention, the second support initially has a thickness greater than thickness es, the method further comprising, before the bonding step, thinning the second support down to thickness es.

According to an embodiment of the invention, thicknesses es and ev are greater than 50 µm.

According to an embodiment of the invention, the second material is single-crystal silicon.

According to an embodiment of the invention, the first material is isolating.

According to an embodiment of the invention, the first material is transparent.

According to an embodiment of the invention, the first material is glass.

The present invention also provides a support for a multilayer structure intended to be bonded to an additional support made of a first material having a Young's modulus Ev and a thickness ev, the support being made of a second material having a Young's modulus Es, different from Young's modulus Ev, and a thickness es verifying, to within 10%, relation:

$$e_s = \frac{E_v}{E_s} e_v.$$

According to an embodiment of the invention, the second material is single-crystal silicon.

BRIEF DESCRIPTION OF THE DRAWINGS

The foregoing and other objects, features, and advantages of the present invention will be discussed in detail in the following non-limiting description of specific embodiments in connection with the accompanying drawings, among which.

DESCRIPTION OF EMBODIMENTS OF THE PRESENT INVENTION

Figure 1A:
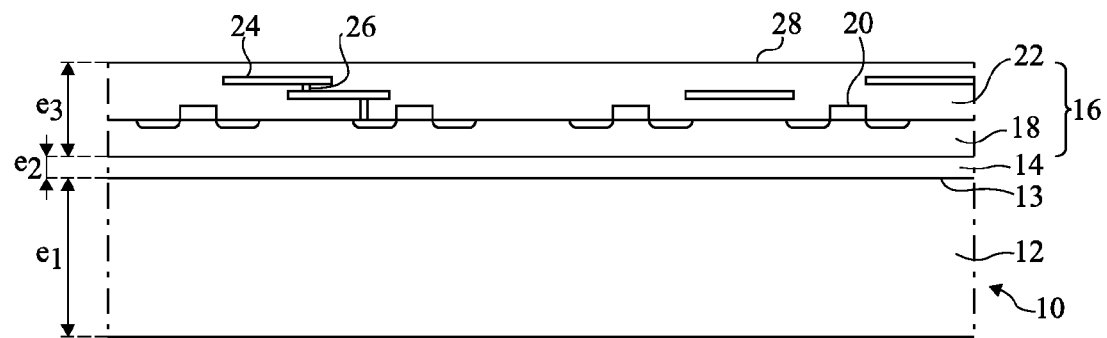
FIGS. 1A to 1C, previously described, show the structures obtained at successive steps of a known method of manufacturing an integrated circuit wafer on an insulating support.
Figure 1B:
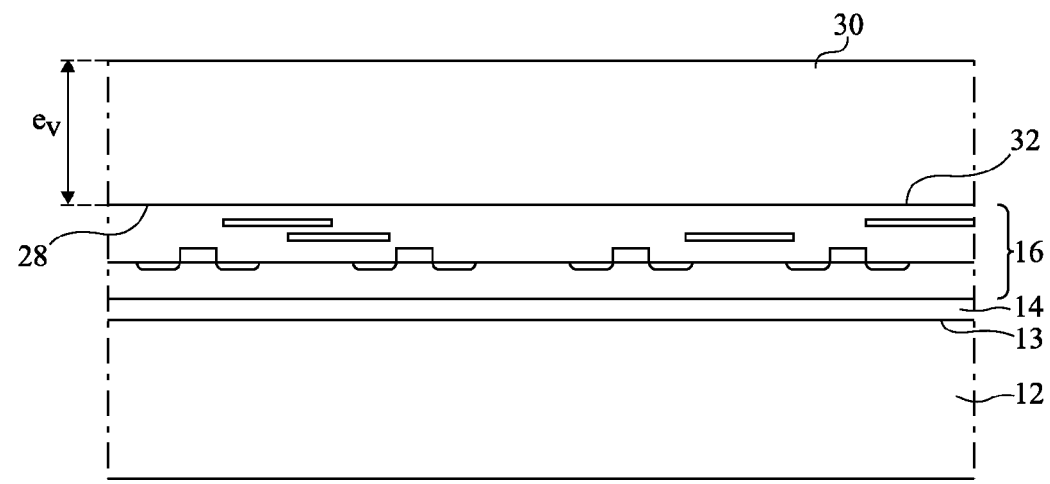
Figure 1C:
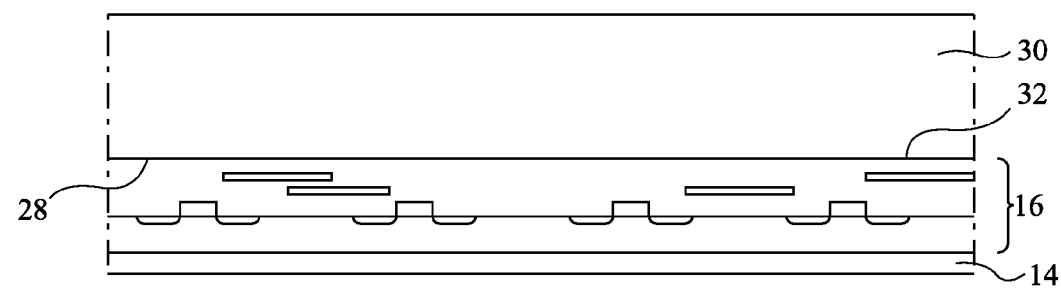

For clarity, the same elements have been designated with the same reference numerals in the various drawings and, further, as usual in the representation of integrated circuits, the various drawings are not to scale.

The principle of the invention is based on an analysis of the physical phenomena which occur during an operation of molecular bonding of two supports comprising materials of different natures. At the propagating front of the bonded area, a local stretching of the supports can be observed. When the Young's modules of the materials of the supports are different, the resulting local deformations are not identical. The bonded surface of the support having the lowest Young's modulus stretches more than the bonded surface of the support having the highest Young's modulus. The bonding then occurs while the supports are deformed. After having bonded the two supports and having removed one of the supports to only leave a thin layer bonded to the other support, deformations can be observed in the thin layer.

Generally, on bonding of an integrated circuit wafer on a final glass support, the integrated circuit wafer rests on an initial support, which is subsequently removed, and which is a single-crystal silicon substrate. The inventors have shown that, during the molecular bonding of the integrated circuit wafer on the final support, the resulting deformations observed in the integrated circuit wafer are essentially due to the nature of the initial support material used to apply the integrated circuit wafer against the final support. Indeed, the thickness of the integrated circuit wafer is low as compared with the thickness of the initial support, and it may be neglected. The Young's modulus of glass is smaller than the Young's modulus of silicon so that, after the bonding, a negative enlargement can be observed in a plane of the integrated circuit wafer parallel to the bonded surfaces.

During the phase of bonding between the final support and the initial support, the elastic energies stored in each support are equal, which translates as the following relation (1):

$$½V_v E_v \epsilon_v = ½V_s E_s \epsilon_s \quad (1)$$

where Vv is the volume of the final support, Vs is the volume of the initial support, Ev is the Young's modulus of the final support, Es is the Young's modulus of the initial support, $\epsilon v$ is the deformation of the final support, and $\epsilon s$ is the deformation of the initial support. Young's modules Ev and Es are the Young's modules measured in a plane parallel to the bonded surfaces. It is possible for the Young's modulus of one of the supports not to be constant in a plane parallel to the bonded surfaces. In this case, Young's modulus Es or Ev of relation (1) corresponds to an average value.

The inventors have shown that when deformations $\epsilon v$ and $\epsilon s$ are equal, this means that, after bonding, the initial support and the final support find a state of equilibrium with no deformation. It is possible to impose for deformation $\epsilon v$ in the final support to be equal to deformation $\epsilon s$ in the initial support if volumes Vv and Vs verify relation (2) hereafter:

$$V_v E_v = V_s E_s \quad (2)$$

The initial and final supports having the same opposite-facing surface area, relation (2) becomes relation (3) hereafter:

$$e_s = \frac{E_v}{E_s} e_v \quad (3)$$

where es is the thickness of the initial support and ev is the thickness of the final support. Generally, for the forming of an integrated circuit wafer on a glass support, the Young's modulus of the glass support is approximately 70 GPa while the Young's modulus of the initial single-crystal silicon support is approximately 140 GPa. Thickness es of the initial support is then obtained by relation (4) hereafter:

$$e_s \approx 0.5 \, e_v \quad (4)$$

According to an embodiment, a step of determining thickness es of the initial support and thickness ev of the final support is provided so that thicknesses es and ev verify to within 10% previously-indicated relation (3). This step may be implemented by a computer.

FIGS. 2A to 2D show the structures obtained at successive steps of an embodiment of a method of manufacturing an integrated circuit wafer on an insulating support according to the invention.

Figure 2A:
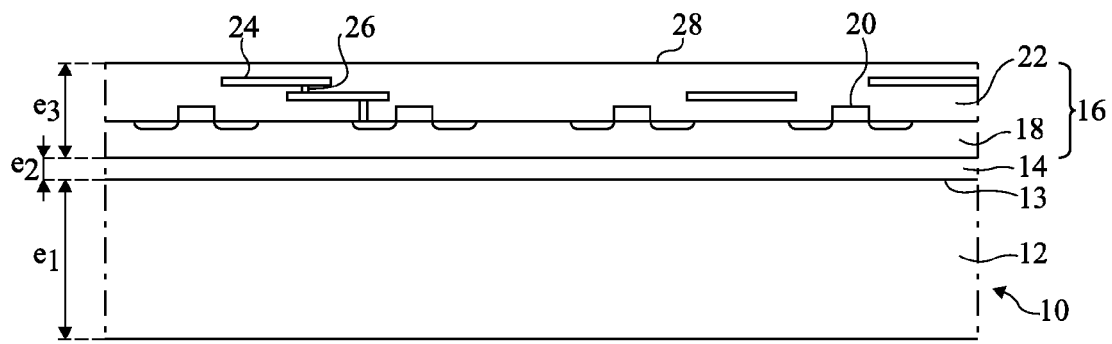
FIGS. 2A to 2D show the structures obtained at successive steps of an embodiment of a method of manufacturing an integrated circuit wafer on an insulating support according to the present invention.

FIG. 2A shows a structure 10 identical to the structure shown in FIG. 1A. Thickness e1 of initial support 12 is for example in the order of 700 micrometers. This corresponds to the standard thickness of the silicon substrates conventionally used in integrated circuit manufacturing methods.

Figure 2B:
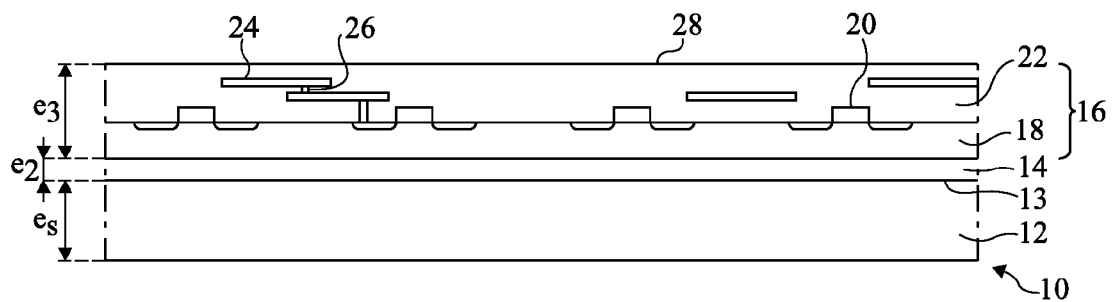

FIG. 2B shows the structure obtained after a step of thinning initial support 12. This step may be carried out by chem.-mech.rectification. The thickness of intermediate support 12 is decreased down to thickness es, provided by relation (4). The equality of relation (4) may be verified to within 10% while providing satisfactory results. As an example, when thickness ev of final glass support 30 is in the order of 700 µm, decreased thickness es may be in the order of 350 µm.

Figure 2C:
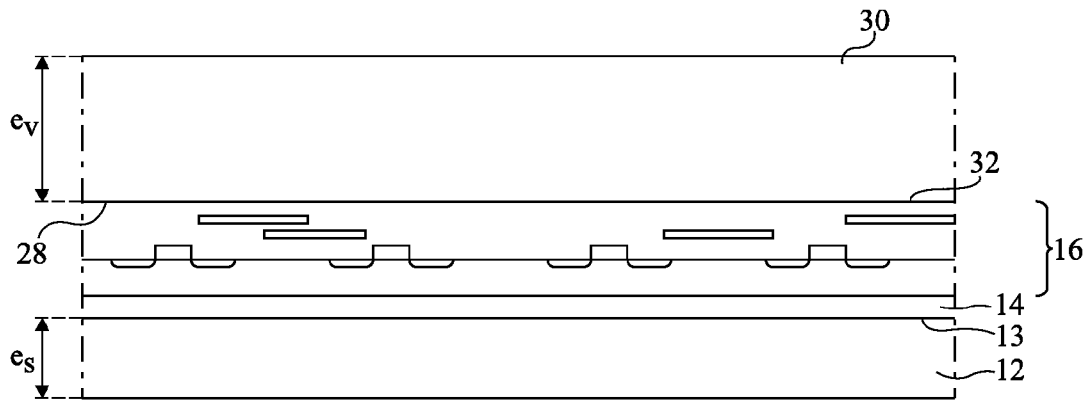

FIG. 2C shows the structure obtained after having performed a molecular bonding between surfaces 28 and 32. Final support 30 is made of an isolating and transparent material. It for example is glass. It for example is borosilicate glass commercialized by Corning under trade name Eagle 2000.

In known fashion, the molecular bonding method may comprise steps of preparing surfaces 28 and 32 to be bonded. If need be, a processing may be carried out so that the roughness of surfaces 28 and 32 is adapted to the performing of a molecular bonding. The preparation steps may further comprise cleaning surfaces 28 and 32 to remove most of the particles present on surfaces 28 and 32 having a diameter, for example, greater than 0.2 µm. The preparation steps may further comprise a chemical treatment of surfaces 28 and 32 to promote a molecular bonding of hydrophilic or hydrophobic type.

The bonding may be performed at ambient temperature. The bonding may be initiated by placing surfaces 28 and 32 against each other and by applying a local pressure on one of the supports. The bonding then starts in an initiation area and a bonding propagating front spreads from the initiation area until surface 28 is totally bonded to surface 32. When supports 30 and 12 are cylindrical, the initiation area may be provided in the central region of surfaces 28 and 32. As a variation, the initiation area may be located on one side of surfaces 28 and 32. An anneal step may then be carried out at a temperature lower than the maximum temperature authorized for the materials used. When final support 30 is made of glass, the anneal may be performed up to a temperature from 400° C. to 500° C. for a duration of at least 1 hour, and generally of a plurality of hours, to increase the bonding energy.

Figure 2D:
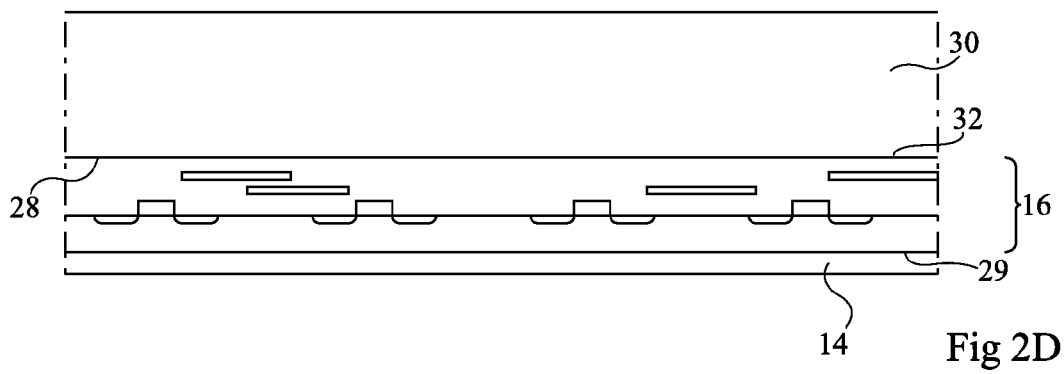

FIG. 2D shows the structure obtained after the removal of initial support 12. The removal of initial support 12 may comprise a step of chem.-mech.rectification to remove most of initial support 12 followed by a step of selective chemical etching to remove the rest of initial support 12. Insulating layer 14 may be used as a stop layer on removal of initial support 12. The relative deformations in integrated circuit wafer 16 which result from the bonding operation are smaller than 5 ppm.

The method generally carries on with the forming of conductive vias through insulating layer 14 and silicon layer 12.

Specific embodiments of the present invention have been described. Various alterations and modifications will occur to those skilled in the art. In particular, although in the previously-described embodiment, the final support is made of glass and the initial support is made of silicon, it should be clear that the present invention may apply to the molecular bonding of any type of material having different Young's modules. As an example, the initial support and/or the final support may be made of a semiconductor material, for example, silicon, germanium, or gallium arsenide, of an isolating material, for example, quartz or sapphire, or of any other low-cost material capable of being used to form a handle substrate, for example, a polymer. Further, although in the previously-described embodiment, the thickness of the initial support is decreased down to thickness es, it should be clear that the thickness rectification step may be carried out on the final support only or both on the initial support and on the final support.

The invention claimed is:

1. A method of manufacturing a multilayer structure on a first support, the method comprising the successive steps of:
   providing the first support made of a first material having a Young's modulus Ev and a thickness ev, and a second support covered with the multilayer structure, the second support being made of a second material having a Young's modulus Es different from Young's modulus Ev, and a thickness es, thicknesses es and ev verifying, to within 10%, relation:

$$e_s = \frac{E_v}{E_s} e_v;$$

performing a molecular bonding between the first support and the multilayer structure; and
   removing the second support.

2. The manufacturing method of claim 1, wherein the second support initially has a thickness greater than thickness es, the method further comprising, before the bonding step, thinning the second support down to thickness es.

3. The manufacturing method of claim 1, wherein thicknesses es and ev are greater than 50 µm.

4. The manufacturing method of claim 1, wherein the second material is single-crystal silicon.

5. The manufacturing method of claim 1, wherein the first material is isolating.

6. The manufacturing method of claim 1, wherein the first material is transparent.

7. The manufacturing method of claim 1, wherein the first material is glass.

8. A support for a multilayer structure intended to be bonded to an additional support made of a first material having a Young's modulus Ev and a thickness ev, the support being made of a second material having a Young's modulus Es, different from Young's modulus Ev, and a thickness es verifying, to within 10%, relation:

$$e_s = \frac{E_v}{E_s} e_v.$$

9. The support of claim 8, wherein the second material is single-crystal silicon.

10. The manufacturing method of claim 2, wherein thicknesses es and ev are greater than 50 µm.

11. The manufacturing method of claim 2, wherein the second material is single-crystal silicon.

12. The manufacturing method of claim 3, wherein the second material is single-crystal silicon.

13. The manufacturing method of claim 2, wherein the first material is isolating.

14. The manufacturing method of claim 3, wherein the first material is isolating.

15. The manufacturing method of claim 4, wherein the first material is isolating.

16. The manufacturing method of claim 2, wherein the first material is transparent.

17. The manufacturing method of claim 3, wherein the first material is transparent.

18. The manufacturing method of claim 4, wherein the first material is transparent.

19. The manufacturing method of claim 5, wherein the first material is transparent.

20. The manufacturing method of claim 19, wherein the first material is glass.

\* \* \* \* \*